(12) United States Patent
Hwang et al.

(10) Patent No.: US 10,653,013 B1
(45) Date of Patent: May 12, 2020

(54) THIN FILM RESISTOR HAVING SURFACE MOUNTED TRIMMING BRIDGES FOR INCREMENTALLY TUNING RESISTANCE

(71) Applicant: The Boeing Company, Chicago, IL (US)

(72) Inventors: Kyu-Pyung Hwang, Newton, MA (US); Young Kyu Song, San Diego, CA (US)

(73) Assignee: The Boeing Company, Chicago, IL (US)

( * ) Notice: Subject to any disclaimer, the term of this patent is extended or adjusted under 35 U.S.C. 154(b) by 0 days.

(21) Appl. No.: 16/559,066

(22) Filed: Sep. 3, 2019

(51) Int. Cl.
| H05K 1/16 | (2006.01) |
| H01C 1/012 | (2006.01) |
| H05K 1/18 | (2006.01) |
| H05K 1/02 | (2006.01) |
| H01C 7/00 | (2006.01) |

(52) U.S. Cl.
CPC ............ *H05K 1/167* (2013.01); *H01C 1/012* (2013.01); *H01C 7/006* (2013.01); *H05K 1/0298* (2013.01); *H05K 1/181* (2013.01)

(58) Field of Classification Search
CPC .... H01C 17/242; H01C 17/245; H01C 1/012; H01C 7/006; H05K 1/167; H05K 1/181
USPC .......................................................... 338/195
See application file for complete search history.

(56) References Cited

U.S. PATENT DOCUMENTS

| 4,906,966 | A  | * | 3/1990 | Imamura | H01C 17/23 219/121.68 |
| 6,288,627 | B1 | * | 9/2001 | Ulmer | H01C 17/242 338/195 |
| 6,310,536 | B1 | * | 10/2001 | Hellriegel | H01C 7/003 338/307 |
| 7,830,241 | B2 | * | 11/2010 | Lai | H01C 1/14 338/307 |
| 2003/0154592 | A1 | * | 8/2003 | Felten | H01C 7/003 29/610.1 |
| 2008/0290984 | A1 | * | 11/2008 | Wei | H05K 1/167 338/309 |
| 2016/0027562 | A1 |   | 1/2016 | Feng et al. | |

OTHER PUBLICATIONS

High Precision Foil Surface Mount Current Sensing Chip Resistors with TCR of ±0.2 ppm/°C., Load Life Stability of ±0.015 %,ESD Immunity up to 25 kV and Fast Thermal Stabilization, Jul. 6, 2012, Document No. 63226,Vishay Precision Group.

* cited by examiner

*Primary Examiner* — Kyung S Lee
(74) *Attorney, Agent, or Firm* — Vivacqua Law, PLLC

(57) ABSTRACT

A resistor assembly is disclosed and comprises a surface mounted layer comprising a first conductive trace, a second conductive trace, and a plurality of trimming bridges that electrically couple the first conductive trace to the second conductive trace. The resistor assembly also comprises a second layer disposed underneath the surface mounted layer. The second layer comprises an embedded thin film resistor electrically coupled to the surface mounted layer. The plurality of trimming bridges are each removable to increase a resistance of the embedded thin film resistor. The resistor assembly also comprises a plurality of vias that electrically couple the first conductive trace of the surface mounted layer to the embedded thin film resistor.

20 Claims, 8 Drawing Sheets

THIN FILM RESISTOR HAVING SURFACE MOUNTED TRIMMING BRIDGES FOR INCREMENTALLY TUNING RESISTANCE

INTRODUCTION

The present disclosure relates to a thin film resistor. More particularly, the present disclosure relates to a thin film resistor having a plurality of surface mounted trimming bridges, where each trimming bridge is removable to incrementally tune a resistance of the thin film resistor.

BACKGROUND

Thin film resistors are typically created by depositing a thin film constructed of a metal alloy upon a substrate. Specifically, the thin film is deposited upon a substrate using a sputtering deposition process. Thin film resistors are found in laminate substrates used for electronic applications such as, for example, printed circuit boards.

A thin film resistor may be attached to a top surface of the electronic substrate or, alternatively, embedded within the laminate substrate. When embedded in a substrate, the thin film resistor is referred to as an embedded thin film resistor. Embedded thin film resistors are typically composed of nickel-chromium alloys such as, for example, nickel chromium aluminum silicon (NiCrAlSi). The nickel-chromium alloy is deposited upon a copper foil. The nickel-chromium alloy and the copper foil are then bonded to a dielectric layer using a lamination process, where the copper foil acts as a conductive layer and the nickel-chromium alloy acts as a resistive layer. The resistive layer is then etched to define discrete embedded thin film resistors. Any number of etching process may be used to define the embedded thin film resistors, however, the specific etching process is selected based on the specific metals included in the nickel-chromium alloy.

The resistance variation of a thin film resistor depends upon several factors. Specifically, physical properties such as, for example, film thickness, residual stress, uniformity, and surface roughness of the conductive layer may affect the resistance variation of the thin film resistor. Moreover, the sheet resistance of the nickel-chromium alloy before etching is inversely proportional to thickness. The thickness of the nickel-chromium layer is determined based on sputtering parameters such as linear speed and power, however, the sputtering parameters may be difficult to control. Additionally, the resolution and specific type of etching used to create the discrete resistor elements also affects the resistance variations. Finally, the temperature and cycle time of the lamination process also affects the resistance of the nickel-chromium alloy. Thus, it is challenging to control the resistance variation of a thin film resistor.

SUMMARY

According to several aspects, a resistor assembly is disclosed. The resistor assembly comprises a surface mounted layer comprising a first conductive trace, a second conductive trace, and a plurality of trimming bridges that electrically couple the first conductive trace to the second conductive trace. The resistor assembly also comprises a second layer disposed underneath the surface mounted layer. The second layer comprises an embedded thin film resistor electrically coupled to the surface mounted layer. The plurality of trimming bridges are each removable to increase a resistance of the embedded thin film resistor. The resistor assembly also comprises a plurality of vias that electrically couple the first conductive trace of the surface mounted layer to the embedded thin film resistor.

In another aspect, a multilayer substrate is disclosed. The multilayer substrate comprises an uppermost layer defining an uppermost surface of the multilayer substrate, a plurality of lower layers that are disposed underneath the uppermost layer, and a resistor assembly. The resistor assembly comprises a surface mounted layer comprising a first conductive trace, a second conductive trace, and a plurality of trimming bridges that electrically couple the first conductive trace to the second conductive trace. The surface mounted layer is disposed along the uppermost layer of the multilayer substrate. The resistor assembly further comprises a second layer disposed underneath the surface mounted layer within one of the plurality of lower layers, where the second layer comprises an embedded thin film resistor electrically coupled to the surface mounted layer. The plurality of trimming bridges are each removable to increase a resistance of the embedded thin film resistor. The resistor assembly also includes a plurality of vias that electrically couple the first conductive trace of the surface mounted layer to the embedded thin film resistor.

In still another aspect, a method for tuning a resistor assembly is disclosed. The method includes obtaining an initial resistance measurement of the resistor assembly by probing a surface mounted layer of the resistor assembly, where an embedded thin film resistor is electrically coupled to a tuning pattern of the surface mounted layer. The tuning pattern comprises one or more pairs of conductive traces. The method further comprises comparing the initial resistance measurement to a defined resistance criteria. In response to determining the initial resistance measurement does not satisfy the defined resistance criteria, the method includes removing one or more trimming bridges that are part of a plurality of trimming bridges of the surface mounted layer. Each pair of conductive traces are electrically coupled to one another by the plurality of trimming bridges.

The features, functions, and advantages that have been discussed may be achieved independently in various embodiments or may be combined in other embodiments further details of which can be seen with reference to the following description and drawings.

BRIEF DESCRIPTION OF THE DRAWINGS

The drawings described herein are for illustration purposes only and are not intended to limit the scope of the present disclosure in any way.

DETAILED DESCRIPTION

A resistor assembly is disclosed. The resistor assembly comprises a thin film resistor electrically coupled to a surface mounted layer. The surface mounted layer of the resistor assembly is disposed along an uppermost layer of a multilayer substrate, and comprises of at least a first conductive trace, a second conductive trace, and a plurality of trimming bridges that electrically couple the first conductive trace to the second conductive trace. In one approach, the thin film resistor is an embedded thin film resistor, however, in an alternative approach the thin film resistor is a surface mounted component disposed along the uppermost surface of the multilayer substrate. The resistance of the thin film resistor is fine-tuned by incrementally removing the trimming bridges to achieve a defined resistance criterion. Accordingly, the method of fine tuning the resistance of the thin film resistor is independent of the processes used to fabricate the thin film resistor and the multilayer substrate.

The following description is merely exemplary in nature and is not intended to limit the present disclosure, application, or uses.

Figure 1:
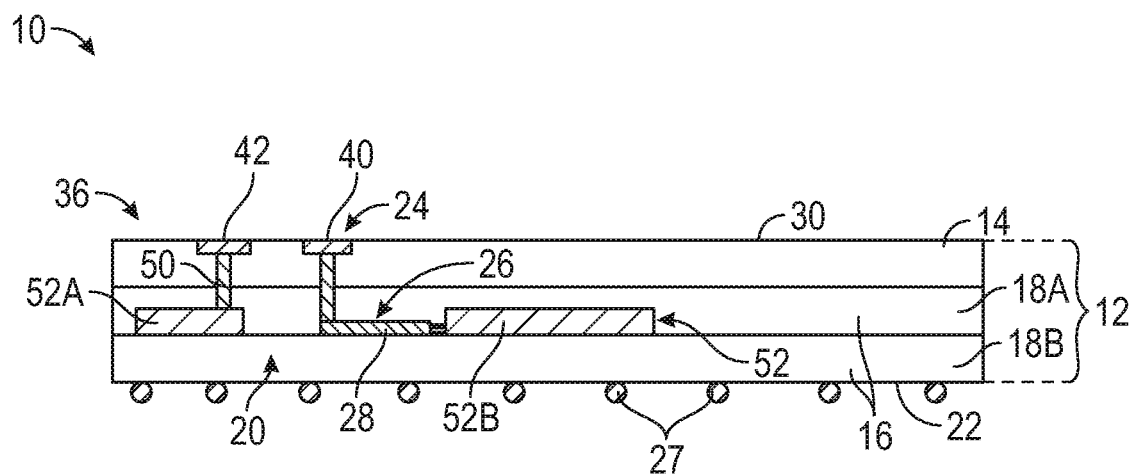
FIG. 1 is a cross-sectioned view of a multilayer substrate comprising a resistor assembly, according to an exemplary embodiment.

Referring to FIG. 1, an exemplary multilayer substrate 10 is shown. The multilayer substrate 10 comprises three or more dielectric layers 12 and a resistor assembly 20. Specifically, the multilayer substrate 10 comprises of an uppermost layer 14 and a plurality of lower layers 16 that are disposed underneath the uppermost layer 14. In the embodiment as shown, the lower layers 16 comprise of one middle layer 18A and a carrier layer that is referred to as a bottommost layer 18B. Although only one middle layer 18A is shown, in an alternative approach the lower layers 16 comprise of more than one middle layer 18A. The bottommost layer 18B defines a lowermost surface 22 of the multilayer substrate 10. A plurality of solder balls 27 are disposed along the lowermost surface 22 of the multilayer substrate 10.

The resistor assembly 20 comprises a surface mounted layer 24 and a second layer 26. The second layer 26 of the resistor assembly 20 is disposed underneath the surface mounted layer 24 and comprises an embedded thin film resistor 28. The surface mounted layer 24 of the resistor assembly 20 is disposed along an uppermost surface 30 of the multilayer substrate 10 and is positioned within the uppermost layer 14 of the multilayer substrate 10. In the embodiment as shown in FIG. 1, the second layer 26 of the resistor assembly 20 is disposed within the middle layer 18A of the multilayer substrate 10. In an embodiment, if the multilayer substrate 10 comprises more than one middle layer 18A, then the thin film resistor 28 is disposed within any of the middle layers 18A. In one non-limiting embodiment, the embedded thin film resistor 28 is constructed of a nickel-chromium alloy such as, but not limited to, nickel chromium aluminum silicon (NiCrAlSi). However, it is to be appreciated that the embedded thin film resistor 28 may be constructed of other resistive alloys as well.

Figure 2:
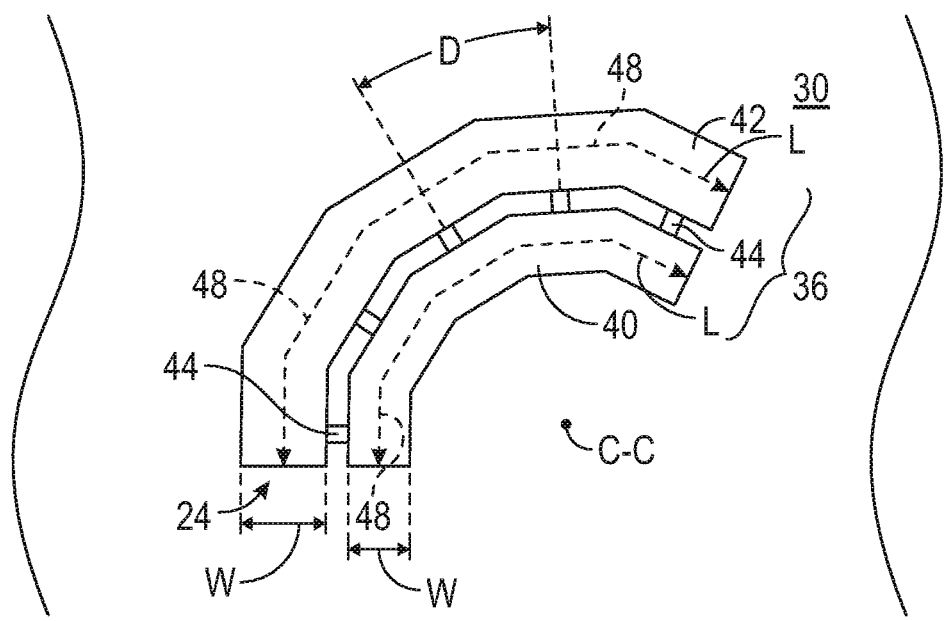
FIG. 2 is a top view of the multilayer substrate shown in FIG. 1 where a surface mounted layer of the resistor assembly is visible, according to an exemplary embodiment.
Figure 3:
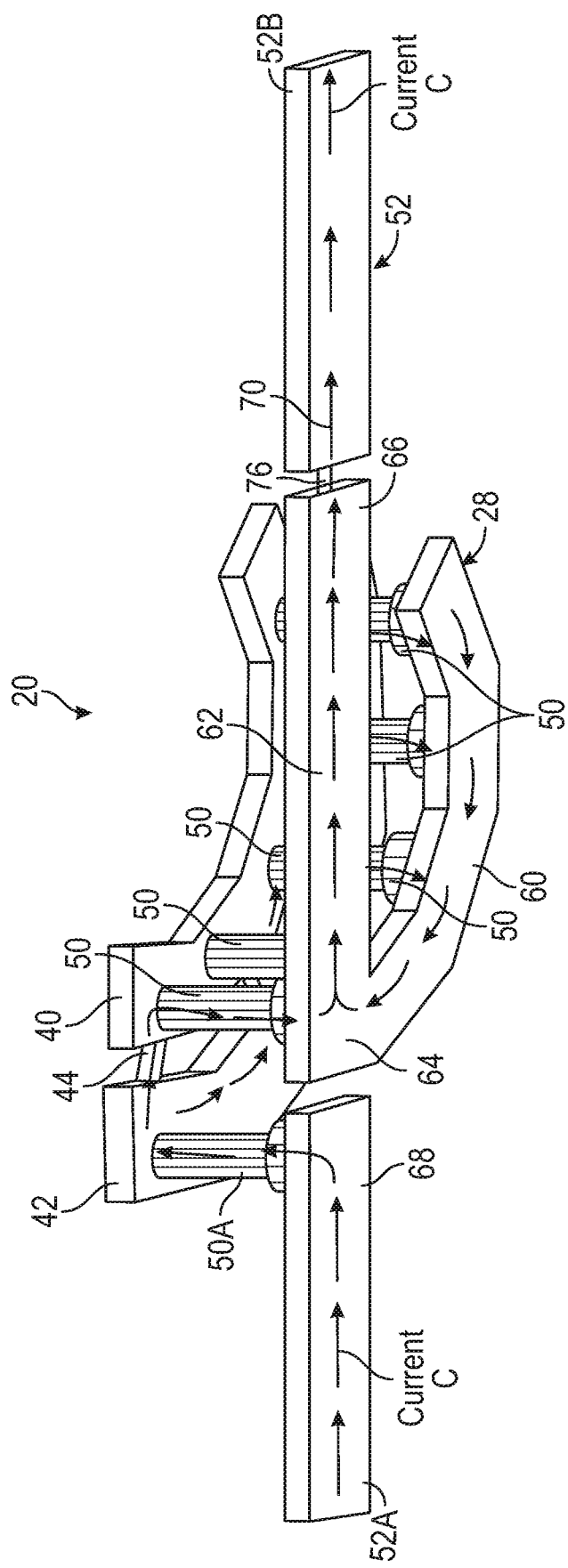
FIG. 3 is an elevated perspective view of the resistor assembly shown in FIG. 1 comprising an embedded thin film resistor and the surface mounted layer, according to an exemplary embodiment.

FIG. 2 is a top view of the uppermost surface 30 of the multilayer substrate 10 shown in FIG. 1, where the surface mounted layer 24 of the resistor assembly 20 is visible. The embedded thin film resistor 28 is not visible in FIG. 2, as the embedded thin film resistor 28 is disposed within the middle layer 18A of the multilayer substrate 10 (seen in FIG. 1). Although FIGS. 1, 2, and 3 illustrate an embedded thin film resistor 28, in an alternative approach seen in FIG. 10 the resistor assembly 20 comprises a surface mounted thin film resistor 428 that is not embedded within the multilayer substrate 10. Instead, the thin film resistor 428 is disposed along the uppermost surface 30 of the multilayer substrate 10. The thin film resistor 428 is described below.

Referring back to FIG. 2, the surface mounted layer 24 comprises a first conductive section 36. Although FIG. 2 illustrates the surface mounted layer 24 comprising of only the first conductive section 36, in the embodiments shown in FIGS. 4A, 4B, and 5, the surface mounted layer 24 also comprises a second conductive section 38 as well, which is described below. Referring to FIG. 2, the first conductive section 36 of the surface mounted layer 24 comprises a first conductive trace 40, a second conductive trace 42, and a plurality of trimming bridges 44 that electrically couple the first conductive trace 40 to the second conductive trace 42. As explained below, the plurality of trimming bridges 44 are each removeable to incrementally adjust a resistance of the embedded thin film resistor 28.

Although FIG. 2 illustrates five trimming bridges 44 electrically coupling the first conductive trace 40 to the second conductive trace 42, the surface mounted layer 24 may comprise any number of multiple trimming bridges 44. It is to be appreciated that increasing the number of trimming bridges 44 results in the ability to adjust the resistance of the embedded thin film resistor 28 with greater precision. The surface mounted layer 24 of the resistor assembly 20 is constructed of a conductive alloy such as, but not limited to, copper or aluminum. FIG. 2 also illustrates the plurality of trimming bridges 44 spaced at equal distances D from one another, where spacing the trimming bridges 44 at equal distances D from one another result in a linear increase in the resistance of the embedded thin film resistor 28 as each trimming bridge 44 is removed. In another embodiment, the trimming bridges 44 are spaced at unequal distances from one another. However, it is to be appreciated that spacing the trimming bridges 44 at unequal distances from one another results in a non-linear increase in resistance between each trimming bridge 44.

In the embodiment as shown, the second conductive trace 42 is positioned radially outward relative to the first conductive trace 40. The first conductive trace 40 and the second conductive trace 42 are arranged concentrically with respect to one another relative to a common central axis 46. The first conductive trace 40 and the second conductive trace 42 are both comprised of a plurality of segments 48 that are arranged in an arcuate profile. Therefore, the first conductive trace 40 and the second conductive trace 42 both comprise an arcuate profile. Although an arcuate profile is illustrated in the figures, it is to be appreciated that the first conductive trace 40 and the second conductive trace 42 are not limited to the profile as shown in the figures and may comprise of other profiles shaped as open polygons. For example, in another embodiment, the first conductive trace 40 and the second conductive trace 42 are shaped as an open pentagon, where the fifth line segment of the pentagon is omitted. However, it is to be appreciated the arcuate profile as seen in FIG. 2 is more compact and requires less space along the uppermost surface 30 of the multilayer substrate 10 when compared to some alternative profiles.

The first conductive trace 40 and the second conductive trace 42 both have the same width W. Furthermore, the first conductive trace 40 and the second conductive trace 42 have a constant width W along their respective lengths L. It is to be appreciated that the equal distances D between the trimming bridges 44, the constant width W of the conductive traces 40, 42, and the arcuate profile of the conductive traces 40, 42 all result in a linear difference in resistance as the trimming bridges 44 are incrementally removed. Thus, as explained below and as seen in FIGS. 6A-6E, when the trimming bridges 44 are removed, this results in a linear increase in resistance of the resistor assembly 20.

FIG. 3 is a perspective view of the resistor assembly 20 shown in FIGS. 1 and 2. Referring to FIGS. 1, 2, and 3, the resistor assembly 20 further comprises a plurality of vias 50 and a conductive path 52, where the conductive path 52 is part of the second layer 26 of the resistor assembly 20. Both the vias 50 and the conductive path 52 are constructed of a conductive alloy. The conductive path 52 is divided into a first portion 52A and a second portion 52B, where the resistor assembly 20 electrically couples the first portion 52A of the conductive path 52 to the second portion 52B of the conductive path 52. Specifically, as seen in FIGS. 1 and 3, one of the plurality of vias 50A electrically couples the first portion 52A of the conductive path 52 to the second conductive trace 42 of the surface mounted layer 24.

Referring specifically to FIG. 3, the embedded thin film resistor 28 comprises a first section 60 and a second section 62. The first section 60 of the embedded thin film resistor 28 is shaped to correspond with a profile of the first conductive trace 40. For example, in the embodiment as shown, the first conductive trace 40 comprises an arcuate profile. Accordingly, the first section 60 of the embedded thin film resistor 28 is shaped as an arcuate profile as well. The second section 62 of the embedded thin film resistor 28 comprises a linear profile. In the embodiment as shown in FIG. 3, the second section 62 of the embedded thin film resistor 28 defines a first end 64 and a second end 66. The first end 64 of the second section 62 of the embedded thin film resistor 28 generally opposes but does not make electrical contact with an end 68 of the first portion 52A of the conductive path 52. However, the second end 66 of the second section 62 of the embedded thin film resistor 28 is electrically coupled to the second portion 52B of the conductive path 52. Specifically, in the embodiment as shown in FIG. 3, an electrical trace 76 electrically couples the second end 66 of the second section 62 of the embedded thin film resistor 28 with an end of the second portion 52B of the conductive path 52.

The plurality of vias 50 electrically couple the first conductive trace 40 of the surface mounted layer 24 to the embedded thin film resistor 28. Specifically, the plurality of vias 50 electrically couple the first conductive trace 40 of the surface mounted layer 24 to the second section 62 of the embedded thin film resistor 28. As mentioned above, the first conductive trace 40 is electrically coupled to the second conductive trace 42 by the trimming bridges 44. Accordingly, as seen in FIG. 3, current C flows from the first portion 52A of the conductive path 52 to the via 50A, and from the via 50A to the second conductive trace 42. The current C then flows from the second conductive trace 42 to the first conductive trace 40 though the trimming bridges 44, and from the first conductive trace 40 to the first section 60 of the embedded thin film resistor 28 by the vias 50. The current C then flows through the thin film resistor 28 and to the second portion 52B of the conductive path 52 through the electrical trace 76.

Figure 4A:
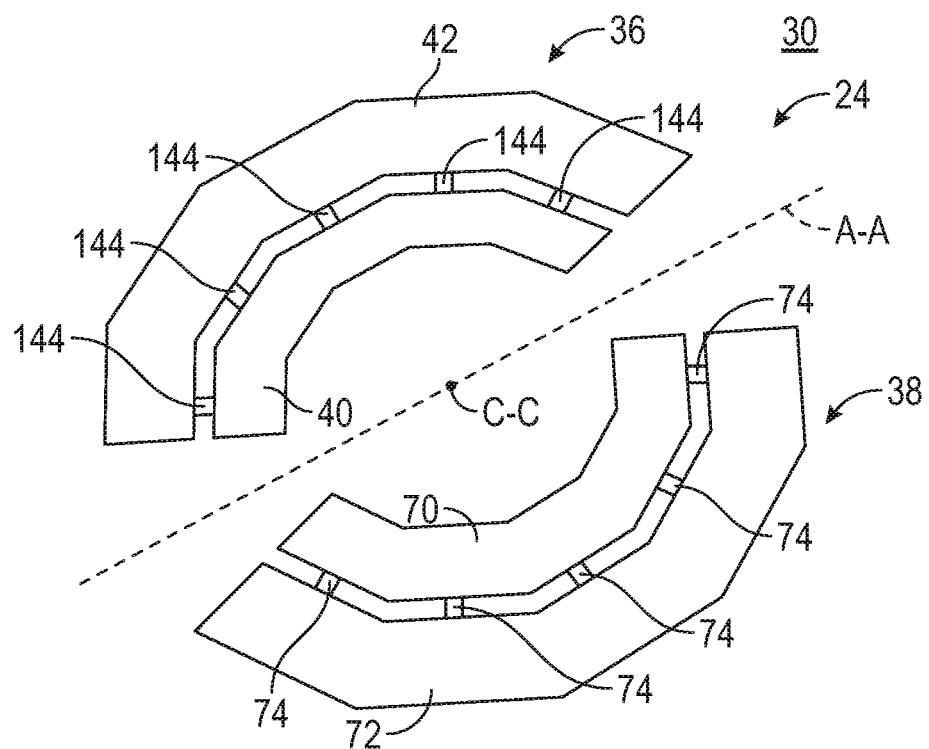
FIG. 4A illustrates another embodiment of the surface mounted layer shown in FIG. 2, according to an exemplary embodiment.
Figure 4B:
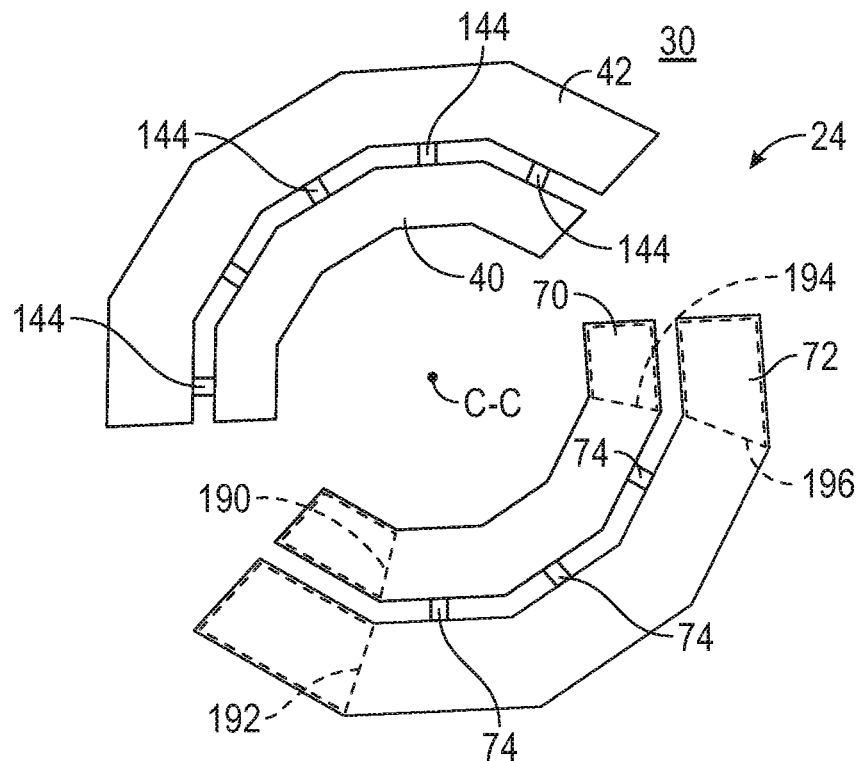
FIG. 4B is an alternative embodiment of the surface mounted layer seen in FIG. 4A, where the surface mounted layer is asymmetrical, according to an exemplary embodiment.
Figure 5:
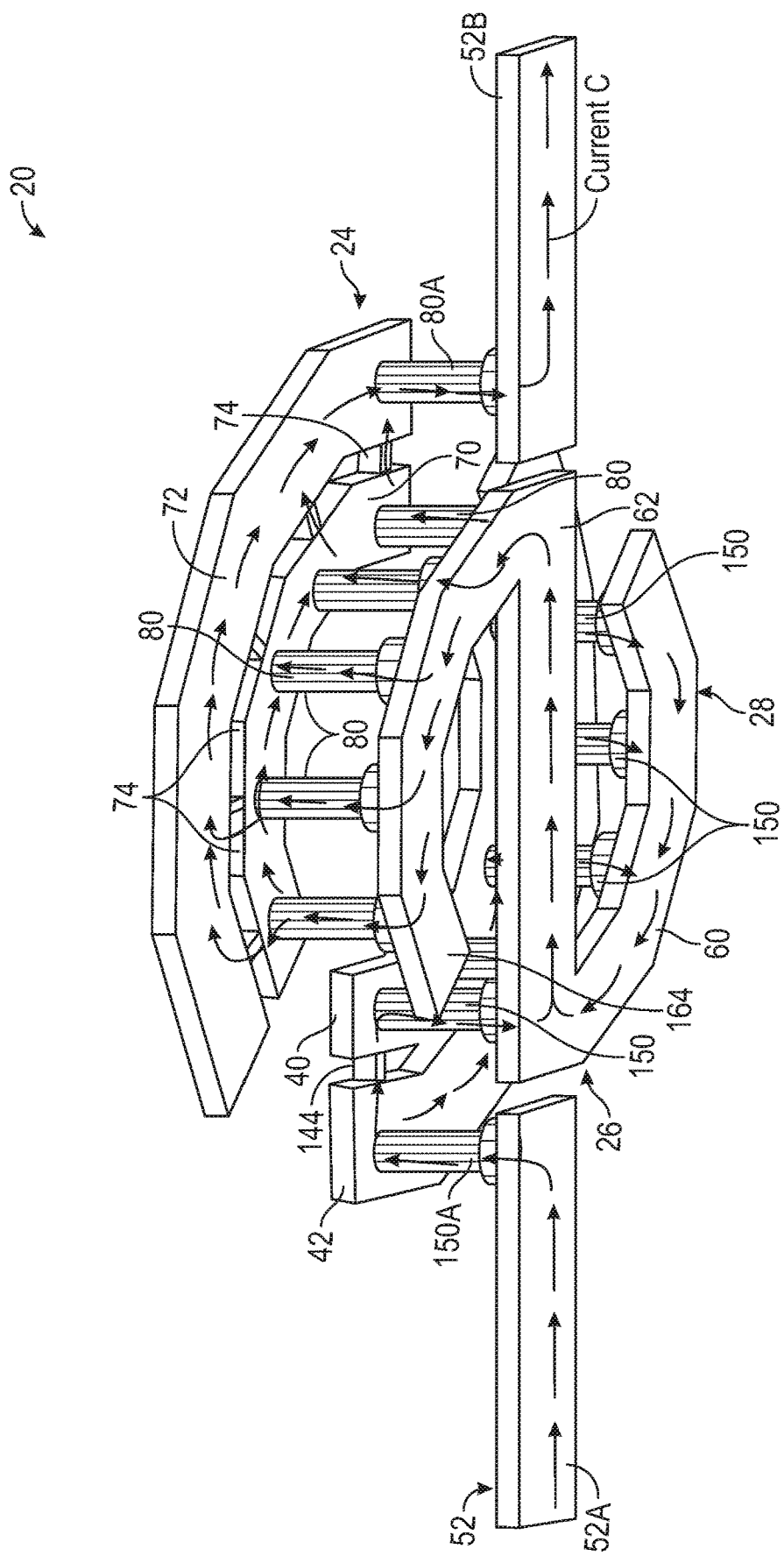
FIG. 5 is a perspective view of the resistor assembly shown in FIG. 4A, according to an exemplary embodiment.

FIG. 4A is a top view of the uppermost surface 30 of the multilayer substrate 10, where the surface mounted layer 24 of the resistor assembly 20 comprises both the first conductive section 36 and the second conductive section 38. FIG. 4B is an alternative embodiment of the surface mounted layer 24 shown in FIG. 4B. FIG. 5 is an elevated perspective view of the resistor assembly 20 shown in FIG. 4A. Referring to FIGS. 4A and 5, in the embodiment as shown, the trimming bridges 44 of the first conductive section 36 are referred to as first trimming bridges 144 and the vias 150 of the first conductive section 36 are referred to as the first vias 150. The resistor assembly 20 further comprises a third conductive trace 70 and a second conductive trace 72 that are electrically coupled to one another. Specifically, the third conductive trace 70 and the fourth conductive trace 72 are electrically coupled to one another by a plurality of second trimming bridges 74. The third conductive trace 70 is electrically coupled to the embedded thin film resistor 28 by a plurality of second vias 80.

Referring to FIG. 4A, the fourth conductive trace 72 is positioned radially outward relative to the third conductive trace 70. The first conductive trace and the second conductive trace are arranged concentrically with respect to one another. Similarly, the third conductive trace 70 and the fourth conductive trace 72 are arranged concentrically with respect to one another. The first conductive trace 40, the second conductive trace 42, the third conductive trace 70, and the fourth conductive trace 72 are each positioned radially outward relative to the common central axis 46. The first conductive trace 40, the second conductive trace 42, the third conductive trace 70 and the fourth conductive trace 72 each comprise an arcuate profile. As mentioned above, the first conductive trace 40, the second conductive trace 42, the third conductive trace 70 and the fourth conductive trace 72 are not limited to the profile as shown in the figures.

Referring to FIG. 5, the second portion 52B of the conductive path 52 is electrically coupled to the fourth conductive trace 72 by one of the second vias 80A. In the embodiment as shown in FIG. 5, the embedded thin film resistor 28 comprises the first section 60, the second section 62, and an additional third section 164. The first section 60 of the embedded thin film resistor 28 is shaped to substantially correspond with a profile of the first conductive trace 40, the second section 62 of the embedded thin film resistor 28 comprises a linear profile, and the third section 164 of the embedded thin film resistor 28 is shaped to substantially correspond with a profile of the third conductive trace 70.

Referring back to FIG. 4A, in the embodiment as shown the surface mounted layer 24 defines an axis of symmetry A-A disposed along the uppermost surface 30 of the multilayer substrate 10. The axis of symmetry A-A positioned perpendicular with respect to the common central axis C-C. As seen in FIG. 4A, the profiles of the first conductive trace 40 and the second conductive trace 42 are identical to the profiles of the third conductive trace 70 and the fourth conductive trace 72. Furthermore, as seen in FIG. 4A, the surface mounted layer 24 comprises an equal number of first trimming bridges 144 and second trimming bridges 74. Thus, the first conductive section 36 of the surface mounted layer 24 is symmetrical with respect to the second conductive section 38 of the surface mounted layer 24.

Although FIG. 4A illustrates a symmetrical surface mounted layer 24, it is to be appreciated that in another approach the surface mounted layer 24 is not symmetrical. For example, in the embodiment as shown in FIG. 4B, the surface mounted layer 24 comprises an unequal number of first trimming bridges 144 and second trimming bridges 74. Specifically, in the example as shown, there are five first trimming bridges 144 but three second trimming bridges 74. However, it is to be appreciated that FIG. 4B is merely exemplary in nature, and the surface mounted layer 24 may comprise other asymmetrical configurations as well. For example, in another embodiment, the first conductive trace 40 and the second conductive trace 42 comprises a profile that does not match the profile of the third conductive trace 70 and the fourth conductive trace 72. In the example as shown in FIG. 4B, the ends 190, 192 of the third conductive trace 70 and the ends 194, 196 the fourth conductive trace 72 (shown in phantom line) are omitted.

Figure 6A:
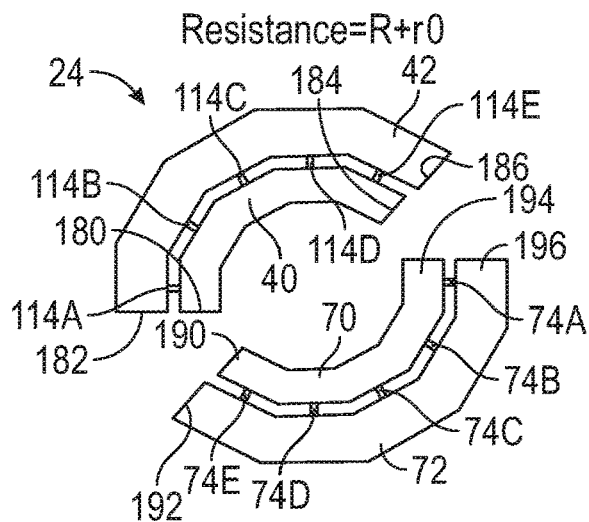
FIGS. 6A-6E illustrate the trimming bridges of the surface mounted layer of the disclosed resistor assembly being trimmed incrementally to tune a resistance, according to an exemplary embodiment.
Figure 6B:
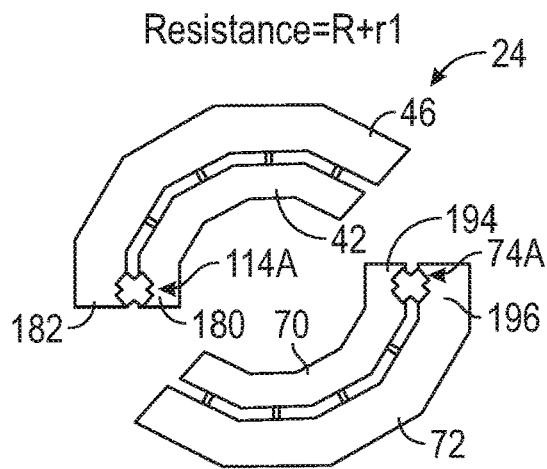

FIGS. 6A-6E illustrate an exemplary process of removing the trimming bridges 74, 144 to tune a resistance of the embedded thin film resistor 28 (not shown in FIGS. 6A-6E). It is to be appreciated that as the trimming bridges 74, 144 are removed, the resistance of the embedded thin film resistor 28 increases. For example, FIG. 6A illustrates an initial condition, where all of the first trimming bridges 144 and the second trimming bridges 74 are intact. Before any trimming bridges 74, 144 are removed, the resistor assembly 20 has an initial resistance of R+r0, where r0=0.

The individual first trimming bridges 144 are arranged as 144A, 144B, 144C, 144D, 144E, where the first trimming bridge 144A is disposed between the end 180 of the first conductive trace 40 and the end 182 of the second conductive trace. The first trimming bridge 144E is disposed between the end 184 of the first conductive trace 40 and the end 186 of the second conductive trace 42. The first trimming bridges 144A, 144B, 144C, 144D, 144E are arranged in chronological order. Accordingly, the first trimming bridge 144A is positioned directly adjacent to first trimming bridge 144B, first trimming bridge 144B is positioned directly adjacent to first trimming bridge 144C, first trimming bridge 144C is positioned directly adjacent to first trimming bridge 144D, and first trimming bridge 144D is positioned adjacent to first trimming bridge 144E. Similarly, the individual second trimming bridges 74 are arranged as 74A, 74B, 74C, 74D, 74E, where the second trimming bridge 74A is disposed between the end 190 of the third conductive trace 70 and the end 192 of the fourth conductive trace 72. The second trimming bridge 74E is disposed between the end 194 of the third conductive trace 70 and the end 196 of the fourth conductive trace 72. The second trimming bridges 74A, 74B, 74C, 74D, 74E are arranged in chronological order.

Figure 6C:
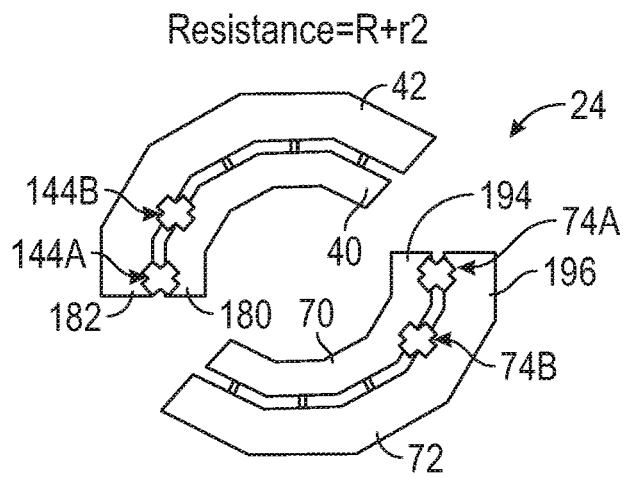
Figure 6D:
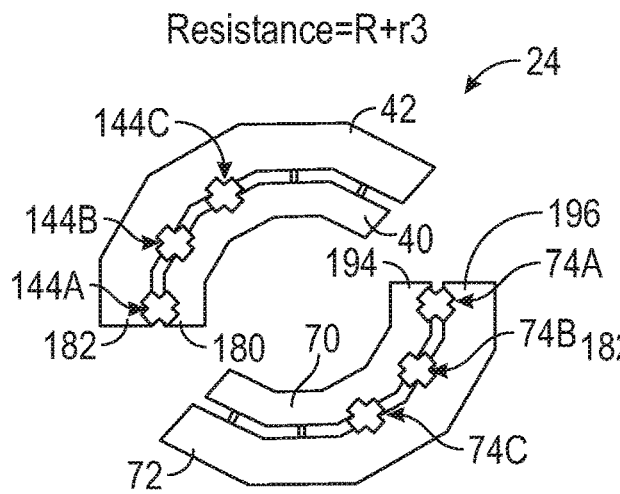
Figure 6E:
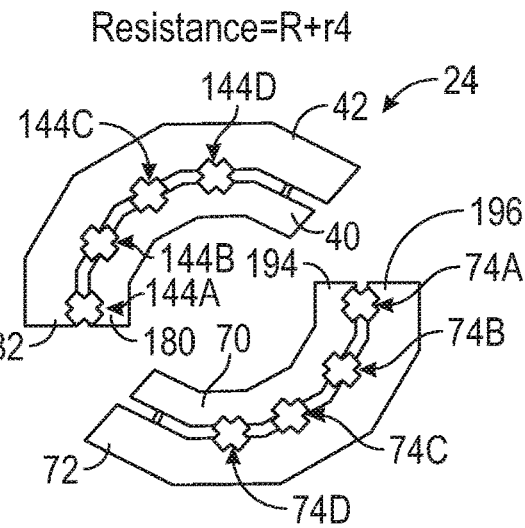

One or more trimming bridges 74, 144 are then removed to incrementally increase the resistance of the resistor assembly 20. For example, referring to FIG. 6B, one of the first trimming bridges 144 and one of the second trimming bridges 74 are removed. Specifically, the trimming bridges 144A and 74A are removed using laser ablation. Accordingly, the resistance of the resistor assembly 20 is now R+r1, where r represents a resistance value that is created by the removal of trimming bridges 74A and 144A. Similarly, as seen in FIG. 6C, the trimming bridges 74B and 144B are removed using laser ablation. Since the surface mounted layer 24 is symmetrical, r2 is twice the value of r1. Accordingly, the resistance of the resistor assembly 20 is now R+r2, where r2 is twice the value of r1. Referring now to FIG. 6D, in an embodiment, the trimming bridges 74C, 144C are removed using laser ablation, and the resistance of the resistor assembly 20 is now R+r3, where r3 is three times the value of r1. Finally, as seen in FIG. 6E, the trimming bridges 74D, 144D are removed using laser ablation, and the resistance of the resistor assembly 20 is now R+r3, where r4 is four times the value of r1.

The surface mounted layer 24 shown in FIGS. 6A-6E is symmetrical, and therefore there is a linear increase in resistance are the trimming bridges 74, 144 are removed. However, if the surface mounted layer 24 is asymmetrical, then the resistance simply increases in value (i.e., r1<r2<r3<r4). Furthermore, it is to be appreciated that while laser ablation is described, other methodologies may also be used to remove the trimming bridges 73, 144 as well. Some examples of other approaches to remove the trimming bridges 74, 144 include, but are not limited to, chemical etching or mechanical removal.

Referring generally to FIGS. 6A-6E, adjacent trimming bridges 74, 144 are removed, which results in an incremental linear increase in resistance. Specifically, the first trimming bridge 144A and the second trimming bridge 74A are removed. Next, the first trimming bridge 144B is removed, where the first trimming bridge 144B is positioned directly adjacent to the first trimming bridge 144A. Moreover, the second trimming bridge 74B is removed, where the second trimming bridge 74B is positioned directly adjacent to the second trimming bridge 74A. Accordingly, there is a linear increase in resistance of r1.

Figure 7:
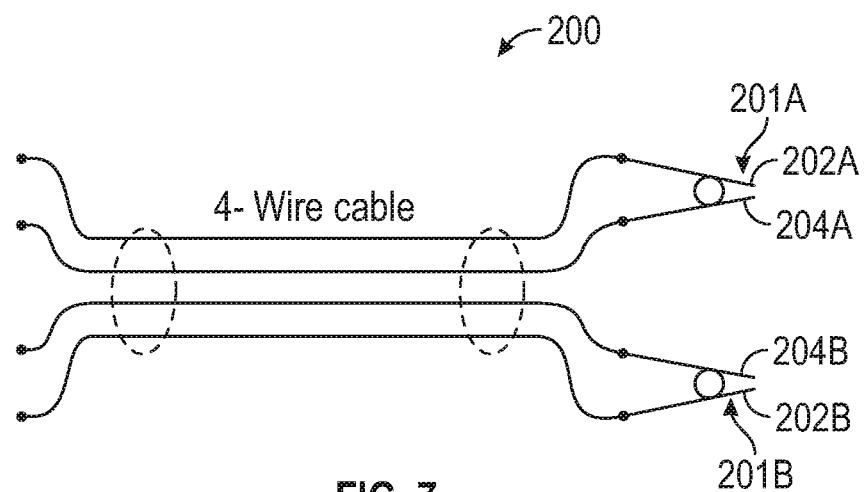
FIG. 7 illustrates an exemplary four-point probe for measuring voltage and current of the surface mounted layer seen in FIGS. 6A-6E, according to an exemplary embodiment.

FIG. 7 is a schematic diagram of an exemplary four-point probe 200 configured to probe the surface mounted layer 24 of the resistor assembly 20 (seen in FIGS. 6A-6E) and obtain resistance measurements. Specifically, the four-point probe 200 performs four-point sensing, which is also referred to as Kelvin sensing. The four-point probe 200 comprises two insulated clips 201A, 201B. The insulated clip 201A comprises two probes 202A, 204A, and the insulated clip 201B comprises probes 202B, 204B. The probes 202A, 202B are configured to measure a current and the probes 204A, 204B configured to measure voltage.

Figure 8:
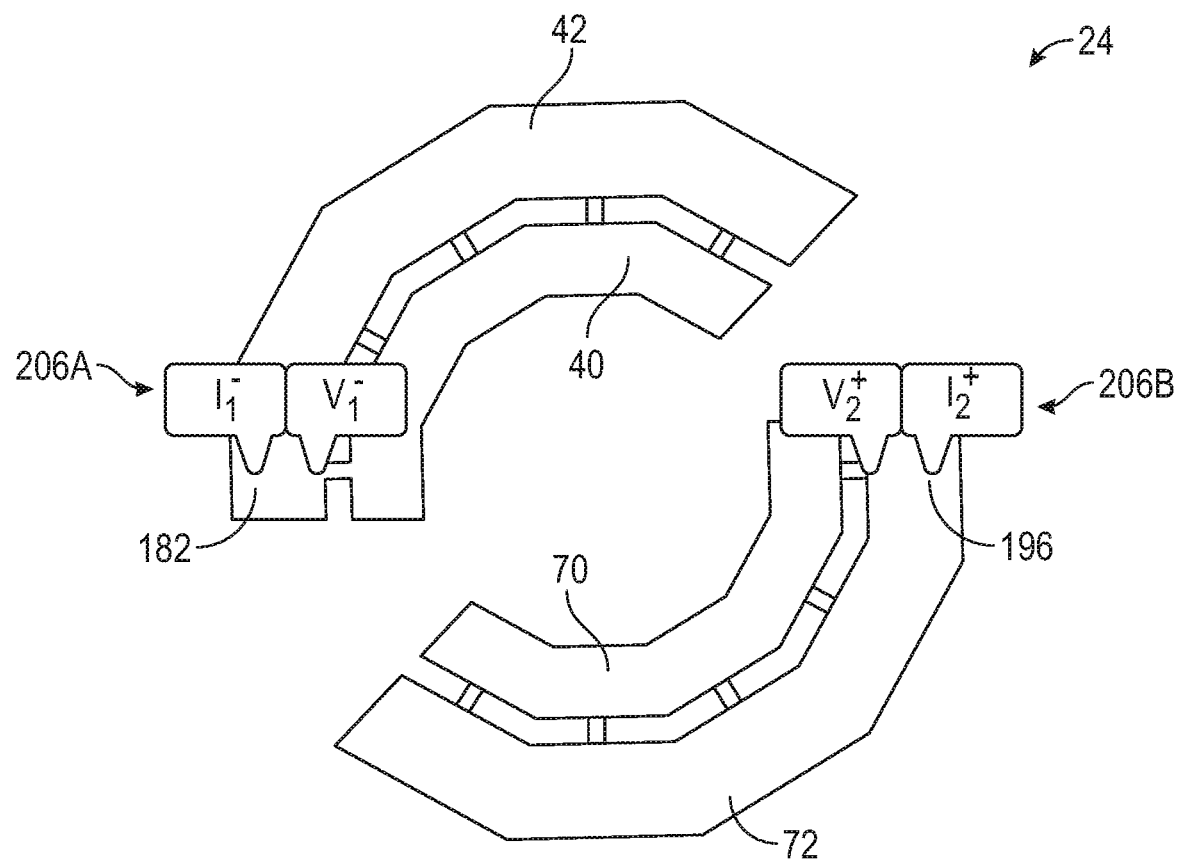
FIG. 8 illustrates locations for measuring the voltage and current on the surface mounted layer, according to an exemplary embodiment.

FIG. 8 is an illustration of the surface mounted layer 24 of the resistor assembly 20. A first probing location 206A is located on the end 182 of the second conductive trace 42 of the surface mounted layer 24 and corresponds to the clip 201A. The four-point probe 200 measures a first current measurement $I_1$ and a first voltage measurement $V_1$ at the first probing location 206A. A second probing location 206B is located on the end 196 of the third conductive trace 72 and corresponds to the clip 201B. the four-point probe 200 measures a second current measurement $I_2$ and a second voltage measurement $V_2$. The current measurements $I_1$, $I_2$ and the voltage measurements $V_1$, $V_2$ are used to determine the resistance of the resistor assembly 20.

Figure 9:
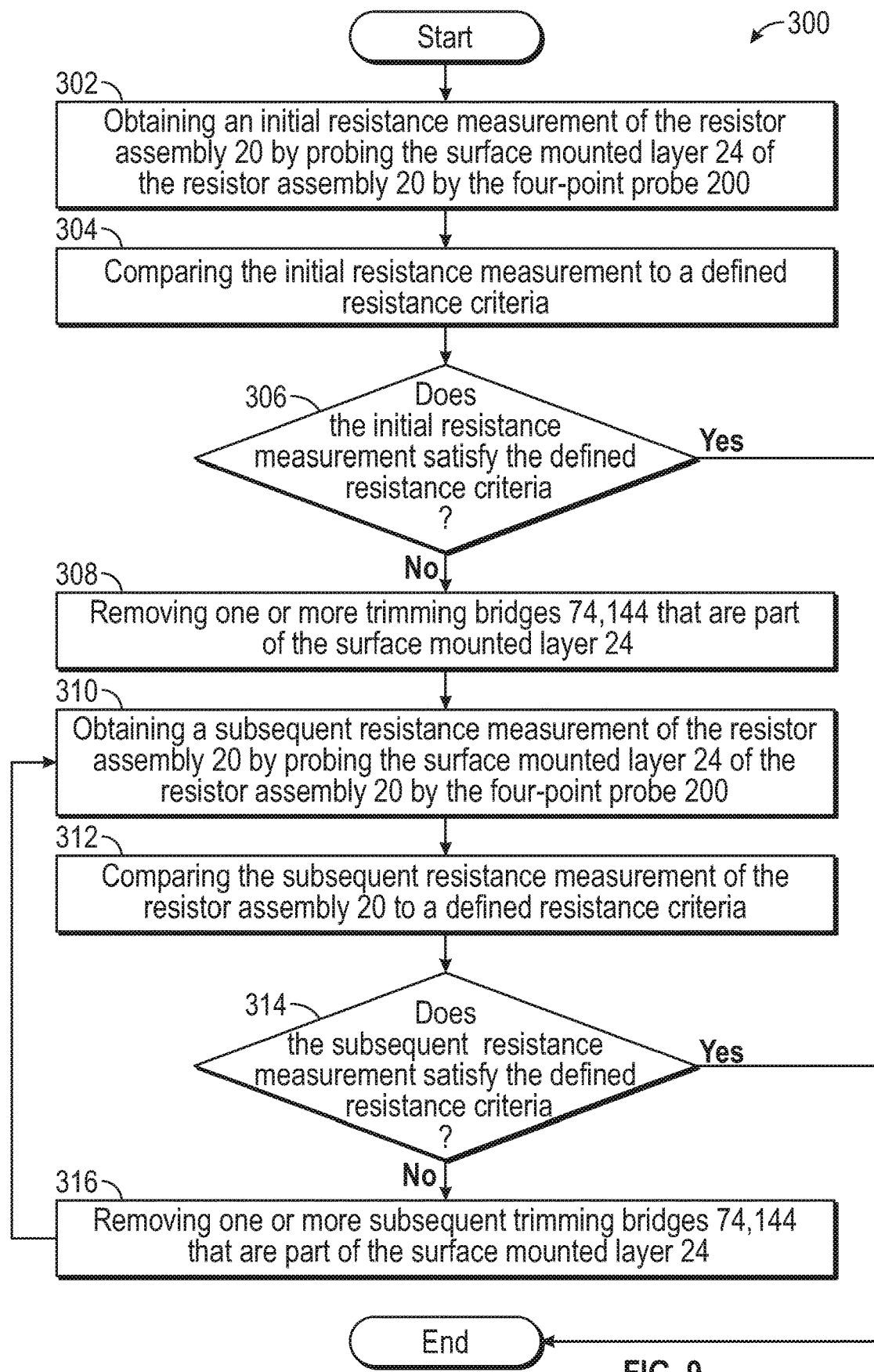
FIG. 9 is a process flow diagram illustrating a method for tuning the resistance of the resistor assembly using the four-point probe shown in FIG. 7, according to an exemplary embodiment.

FIG. 9 is an exemplary process flow diagram illustrating a method 300 for tuning the resistance of the resistor assembly 20. Referring generally to FIGS. 5, 6A-6E, and 7-9, the method 300 begins at block 302. In block 302, an initial resistance measurement of the resistor assembly 20 is obtained by probing the surface mounted layer 24 of the resistor assembly 20 by the four-point probe 200. Referring specifically to FIG. 5, the surface mounted layer 24 of the resistor assembly 20 is electrically coupled to the embedded thin film resistor 28 by a tuning pattern disposed along the surface mounted layer 24 of the resistor assembly 20. The tuning pattern comprises one or more pairs of conductive traces (i.e., the conductive traces 40, 42 and the conductive traces 70, 72), where each pair of conductive traces are electrically coupled to one another by the plurality of trimming bridges 74, 144. The method 300 can then proceed to block 304.

In block 304, the initial resistance measurement is compared to a defined resistance criteria. The defined resistance criteria indicates a resistance range or, alternatively, a resistance threshold of the resistor assembly 20. For example, in one non-limiting embodiment, the predefined resistance criteria is a resistance range that comprises of a tolerance of two percent. The method 300 can then proceed to decision block 306.

In decision block 306, the method 300 can either proceed to block 308 or terminate. Specifically, if the initial resistance measurement satisfies the defined resistance criteria, then the method 300 can then terminate. However, in response to determining the initial resistance measurement does not satisfy the defined resistance criteria the method 300 can then proceed to block 308.

In block 308, one or more trimming bridges 74, 144 that are part of the surface mounted layer 24 are removed. For example, in the embodiment as shown in FIGS. 6A-6E, the surface mounted layer 24 comprises two pairs of conductive traces (40, 42, and 70, 72). Therefore, two trimming bridges 74, 144 are removed at a time. However, in the embodiment as shown in FIGS. 2 and 3, the surface mounted layer 24 comprises only one pair of conductive traces 40, 42. Accordingly, one trimming bridge 44 is removed at a time. As mentioned above, the trimming bridges 74, 144 are removed using laser ablation. The method 300 can then proceed to block 310.

In block 310, a subsequent resistance measurement of the resistor assembly 20 is obtained by probing the surface mounted layer 24 of the resistor assembly 20 by the four-point probe 200. The method 300 can then proceed to block 312.

In block 312, the subsequent resistance measurement of the resistor assembly 20 is compared to the defined resistance criteria. The method 300 can then proceed to decision block 314.

In decision block 314, the method 300 can either proceed to block 308 or terminate. Specifically, if the subsequent resistance measurement satisfies the defined resistance criteria, then the method 300 can then terminate. However, in response to determining the subsequent resistance measurement does not satisfy the defined resistance criteria the method 300 can then proceed to block 316.

In block 316, one or more subsequent trimming bridges 74, 144 that are part of the surface mounted layer 24 are removed. For example, the one or more subsequent trimming bridges 74, 144 are shown in FIG. 6C as trimming bridges 74B, 144B. In the embodiment as shown in FIG. 6D, the one or more subsequent trimming bridges 74, 144 are shown as 74C, 144C. In the embodiment as shown in FIG. 6E, the one or more subsequent trimming bridges 74, 144 are shown as 74D, 144D. The method 300 can then return to block 310 to obtain another subsequent resistance measurement.

Figure 10:
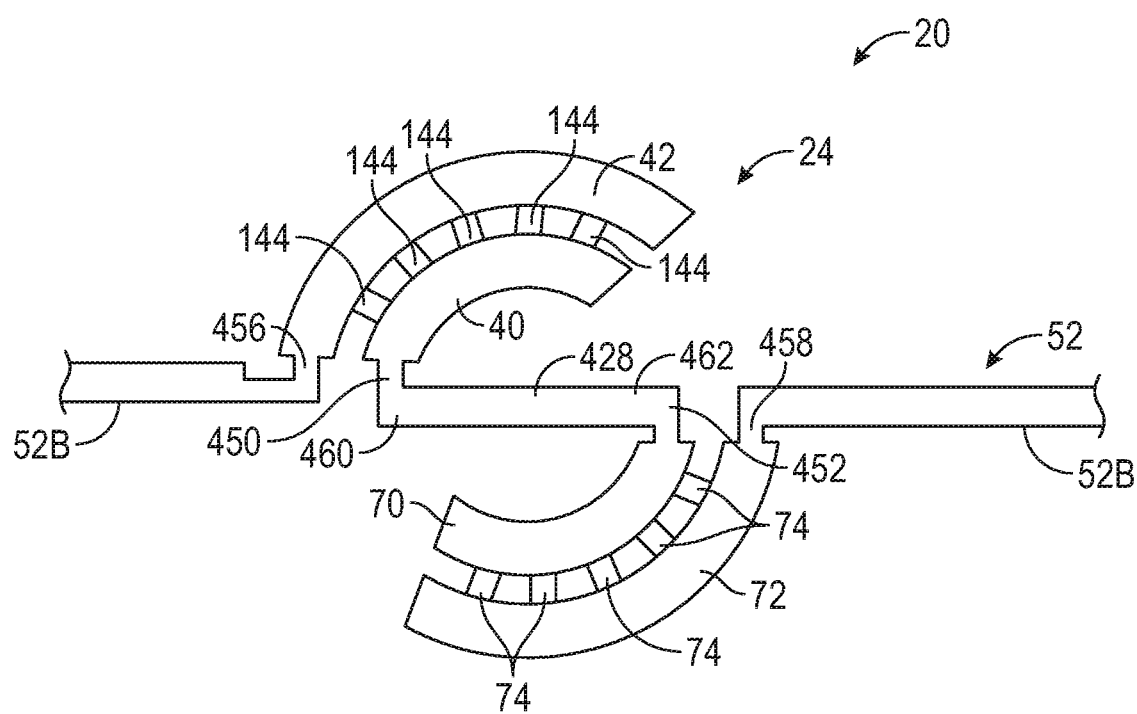
FIG. 10 is a top view of an alternative embodiment of the resistor assembly comprising a surface mounted thin film resistor, according to an exemplary embodiment.

FIG. 10 illustrates an alternative embodiment of a resistor assembly 20 comprising a thin film resistor 428. As seen in FIG. 10, the thin film resistor 428 is not embedded within the multilayer substrate 10. Instead, the thin film resistor 428 is part of the surface mounted layer 24. In other words, the thin film resistor 428 is disposed along the uppermost surface 30 of the multilayer substrate 10 (FIG. 1). However, it is to be appreciated that surface mounting the thin film resistor 428 requires more area along the uppermost surface 30 of the multilayer substrate 10 when compared to the embedded thin film resistor 28. Similar to the embodiment as shown in FIG. 5, the first conductive trace 40 is electrically coupled to the second conductive trace 42 by the plurality of first trimming bridges 144, and the third conductive trace 70 is electrically coupled to the fourth conductive trace 72 by the plurality of second trimming bridges 74.

The thin film resistor 428 is electrically coupled to the first conductive trace 40 by an electrical trace 450. Specifically, the thin film resistor 428 defines a first end 460 and a second end 462, where the first end 460 of the thin film resistor 428 is electrically coupled to the first conductive trace 40 by the electrical trace 450. The thin film resistor 428 is electrically coupled to the third conductive trace 70 by an electrical trace 452. Specifically, the second end 462 of the thin film resistor 428 is electrically coupled to the third conductive trace 70 by the electrical trace 452. Both electrical traces 450, 452 are conductive lines or, alternatively, solder drops.

The second conductive trace 42 is electrically coupled to the first portion 52A of the conductive path 52 by an electrical trace 456. Similarly, the fourth conductive trace 72 is electrically coupled to the second portion 52B of the conductive path 52 by an electrical trace 458. The electrical traces 450, 452, 456, and 458 are all part of the surface mounted layer 24 of the resistor assembly 20.

Referring generally to the figures, the present disclosure offers various technical effects and benefits. Specifically, the resistance of the thin film resistor is fine-tuned by incrementally removing the trimming bridges to achieve a defined resistance criterion. Accordingly, the disclosure provides a system and method for fine-tuning the resistance of the thin film resistor that is independent of the processes used to fabricate the thin film resistor and the multilayer substrate. The disclosed approach for fine-tuning a thin film resistor is especially advantageous, since it may be relatively difficult to control the fabrication processes used to create the thin film resistor and the corresponding multilayer substrate.

Further, the disclosure comprises embodiments according to the following clauses:

Clause 1: resistor assembly, comprising: a surface mounted layer comprising a first conductive trace, a second conductive trace, and a plurality of trimming bridges that electrically couple the first conductive trace to the second conductive trace; a second layer disposed underneath the surface mounted layer, wherein the second layer comprises an embedded thin film resistor electrically coupled to the surface mounted layer, wherein the plurality of trimming bridges are each removable to increase a resistance of the embedded thin film resistor; and a plurality of vias that electrically couple the first conductive trace of the surface mounted layer to the embedded thin film resistor.

Clause 2: the resistor assembly of clause 1, wherein the plurality of trimming bridges are spaced at equal distances from one another, and wherein spacing the trimming bridges at equal distances from one another results in a linear increase in the resistance of the embedded thin film resistor as each trimming bridge is removed.

Clause 3: the resistor assembly of any of clauses 1 or 2, wherein the first conductive trace and the second conductive trace are arranged concentrically with respect to one another.

Clause 4: the resistor assembly of any of clauses 1, 2, or 3, wherein the first conductive trace and the second conductive trace both comprise an arcuate profile.

Clause 5: the resistor assembly of any of clauses 1, 2, 3, or 4, further comprising a conductive path that is part of the second layer of the resistor assembly, wherein one of the plurality of vias electrically couples a first portion of the conductive path to the second conductive trace of the surface mounted layer.

Clause 6: the resistor assembly of any of clauses 1, 2, 3, 4, or 5, wherein a second portion of the conductive path is electrically coupled to the embedded thin film resistor.

Clause 7: the resistor assembly of any of clauses 1, 2, 3, 4, 5, or 6, wherein the plurality of vias are a plurality of first vias and the plurality of trimming bridges are first trimming bridges, and wherein the surface mounted layer further comprises: a third conductive trace and a fourth conductive trace electrically coupled to one another, wherein the third conductive trace and the fourth conductive trace are electrically coupled to the embedded thin film resistor by a plurality of second vias.

Clause 8: the resistor assembly of any of clauses 1, 2, 3, 4, 5, 6, or 7, wherein the third conductive trace and the fourth conductive trace are electrically coupled to one another by a plurality of second trimming bridges.

Clause 9: the resistor assembly of any of clauses 1, 2, 3, 4, 5, 6, 7, or 8, wherein the first conductive trace and the second conductive trace are arranged concentrically with respect to one another, and the third conductive trace and the fourth conductive trace are arranged concentrically with respect to one another.

Clause 10: the resistor assembly of any of clauses 1, 2, 3, 4, 5, 6, 7, 8, or 9, wherein first conductive trace, the second conductive trace, the third conductive trace, and the fourth conductive trace each comprise an arcuate profile.

Clause 11: the resistor assembly of any of clauses 1, 2, 3, 4, 5, 6, 7, 8, 9, or 10, wherein the surface mounted layer comprises an equal number of first trimming bridges and second trimming bridges.

Clause 12: a multilayer substrate, comprising: an uppermost layer defining an uppermost surface of the multilayer substrate; a plurality of lower layers that are disposed underneath the uppermost layer; and a resistor assembly, comprising: a surface mounted layer comprising a first conductive trace, a second conductive trace, and a plurality of trimming bridges that electrically couple the first conductive trace to the second conductive trace, wherein the surface mounted layer is disposed along the uppermost layer of the multilayer substrate; a second layer disposed underneath the surface mounted layer within one of the plurality of lower layers, wherein the second layer comprises an embedded thin film resistor electrically coupled to the surface mounted layer, wherein the plurality of trimming bridges are each removable to increase a resistance of the embedded thin film resistor; and a plurality of vias that electrically couple the first conductive trace of the surface mounted layer to the embedded thin film resistor.

Clause 13: the multilayer substrate of clause 12, wherein the lower layers further comprise a one middle layer and a lower layer, wherein the embedded thin film resistor is disposed within the middle layer.

Clause 14: the multilayer substrate of any of clauses 12 or 13, wherein the plurality of trimming bridges are spaced at equal distances from one another, wherein spacing the trimming bridges at equal distances from one another results in a linear increase in the resistance of the embedded thin film resistor as each trimming bridge is removed.

Clause 15: the multilayer substrate of any of clauses 12, 13 or 14, wherein the plurality of vias are a plurality of first vias and the plurality of trimming bridges are first trimming bridges, and wherein the surface mounted layer further comprises: a third conductive trace and a fourth conductive trace electrically coupled to one another, wherein the third conductive trace and the fourth conductive trace are electrically coupled to the embedded thin film resistor by a plurality of second vias.

Clause 16: the multilayer substrate of any of clauses 12, 13, 14, or 15, wherein the third conductive trace and the fourth conductive trace are electrically coupled to one another by a plurality of second trimming bridges.

Clause 17: a method for tuning a resistor assembly, the method comprising: obtaining an initial resistance measurement of the resistor assembly by probing a surface mounted layer of the resistor assembly, wherein an embedded thin film resistor is electrically coupled to a tuning pattern of the surface mounted layer, wherein the tuning pattern comprises one or more pairs of conductive traces; comparing the initial resistance measurement to a defined resistance criteria; and in response to determining the initial resistance measurement does not satisfy the defined resistance criteria, removing one or more trimming bridges that are part of a plurality of trimming bridges of the surface mounted layer, wherein each pair of conductive traces are electrically coupled to one another by the plurality of trimming bridges.

Clause 18: the method of clause 17, further comprising: obtaining a subsequent resistance measurement of the resistor assembly is obtained by probing the surface mounted layer of the resistor assembly by the four-point probe; and comparing the subsequent resistance measurement of the resistor assembly to the defined resistance criteria.

Clause 19: the method of any of clauses 17 or 18, further comprising: in response to determining the subsequent resistance measurement does not satisfy the defined resistance criteria, removing one or more subsequent trimming bridges that are part of the surface mounted layer.

Clause 20: the method of any of clauses 17, 18, or 19, wherein the one or more trimming bridges are removed using laser ablation.

The description of the present disclosure is merely exemplary in nature and variations that do not depart from the gist of the present disclosure are intended to be within the scope of the present disclosure. Such variations are not to be regarded as a departure from the spirit and scope of the present disclosure.

What is claimed is:

1. A resistor assembly, comprising:
   a surface mounted layer comprising a first conductive trace, a second conductive trace, and a plurality of trimming bridges that electrically couple the first conductive trace to the second conductive trace;
   a second layer disposed underneath the surface mounted layer, wherein the second layer comprises an embedded thin film resistor electrically coupled to the surface mounted layer, wherein the plurality of trimming bridges are each removable to increase a resistance of the embedded thin film resistor; and
   a plurality of vias that electrically couple the first conductive trace of the surface mounted layer to the embedded thin film resistor.

2. The resistor assembly of claim 1, wherein the plurality of trimming bridges are spaced at equal distances from one another, wherein spacing the plurality of trimming bridges at equal distances from one another results in a linear increase in the resistance of the embedded thin film resistor as each trimming bridge is removed.

3. The resistor assembly of claim 1, wherein the first conductive trace and the second conductive trace are arranged concentrically with respect to one another.

4. The resistor assembly of claim 3, wherein the first conductive trace and the second conductive trace both comprise an arcuate profile.

5. The resistor assembly of claim 1, further comprising a conductive path that is part of the second layer of the resistor assembly, wherein one of the plurality of vias electrically couples a first portion of the conductive path to the second conductive trace of the surface mounted layer.

6. The resistor assembly of claim 5, wherein a second portion of the conductive path is electrically coupled to the embedded thin film resistor.

7. The resistor assembly of claim 1, wherein the plurality of vias are a plurality of first vias and the plurality of trimming bridges are first trimming bridges, and wherein the surface mounted layer further comprises:
a third conductive trace and a fourth conductive trace electrically coupled to one another, wherein the third conductive trace and the fourth conductive trace are electrically coupled to the embedded thin film resistor by a plurality of second vias.

8. The resistor assembly of claim 7, wherein the third conductive trace and the fourth conductive trace are electrically coupled to one another by a plurality of second trimming bridges.

9. The resistor assembly of claim 8, wherein the first conductive trace and the second conductive trace are arranged concentrically with respect to one another, and the third conductive trace and the fourth conductive trace are arranged concentrically with respect to one another.

10. The resistor assembly of claim 9, wherein first conductive trace, the second conductive trace, the third conductive trace, and the fourth conductive trace each comprise an arcuate profile.

11. The resistor assembly of claim 8, wherein the surface mounted layer comprises an equal number of first trimming bridges and second trimming bridges.

12. A multilayer substrate, comprising:
an uppermost layer defining an uppermost surface of the multilayer substrate;
a plurality of lower layers that are disposed underneath the uppermost layer; and
a resistor assembly, comprising:
a surface mounted layer comprising a first conductive trace, a second conductive trace, and a plurality of trimming bridges that electrically couple the first conductive trace to the second conductive trace, wherein the surface mounted layer is disposed along the uppermost layer of the multilayer substrate;
a second layer disposed underneath the surface mounted layer within one of the plurality of lower layers, wherein the second layer comprises an embedded thin film resistor electrically coupled to the surface mounted layer, wherein the plurality of trimming bridges are each removable to increase a resistance of the embedded thin film resistor; and
a plurality of vias that electrically couple the first conductive trace of the surface mounted layer to the embedded thin film resistor.

13. The multilayer substrate of claim 12, wherein the lower layers further comprise a one middle layer and a lowermost layer, wherein the embedded thin film resistor is disposed within the middle layer.

14. The multilayer substrate of claim 12, wherein the plurality of trimming bridges are spaced at equal distances from one another, wherein spacing the trimming bridges at equal distances from one another results in a linear increase in the resistance of the embedded thin film resistor as each trimming bridge is removed.

15. The multilayer substrate of claim 12, wherein the plurality of vias are a plurality of first vias and the plurality of trimming bridges are first trimming bridges, and wherein the surface mounted layer further comprises:
a third conductive trace and a fourth conductive trace electrically coupled to one another, wherein the third conductive trace and the fourth conductive trace are electrically coupled to the embedded thin film resistor by a plurality of second vias.

16. The multilayer substrate of claim 15, wherein the third conductive trace and the fourth conductive trace are electrically coupled to one another by a plurality of second trimming bridges.

17. A method for tuning a resistor assembly, the method comprising:
obtaining an initial resistance measurement of the resistor assembly by probing a surface mounted layer of the resistor assembly, wherein an embedded thin film resistor is electrically coupled to a tuning pattern of the surface mounted layer, wherein the tuning pattern comprises one or more pairs of conductive traces;
comparing the initial resistance measurement to a defined resistance criteria; and
in response to determining the initial resistance measurement does not satisfy the defined resistance criteria, removing one or more trimming bridges that are part of a plurality of trimming bridges of the surface mounted layer, wherein each pair of conductive traces are electrically coupled to one another by the plurality of trimming bridges.

18. The method of claim 17, further comprising:
obtaining a subsequent resistance measurement of the resistor assembly is by probing the surface mounted layer of the resistor assembly by a four-point probe; and
comparing the subsequent resistance measurement of the resistor assembly to the defined resistance criteria.

19. The method of claim 18, further comprising:
in response to determining the subsequent resistance measurement does not satisfy the defined resistance criteria, removing one or more subsequent trimming bridges that are part of the surface mounted layer.

20. The method of claim 17, wherein the one or more trimming bridges are removed using laser ablation.

* * * * *